United States Patent [19]

Enderlein

[11] 3,811,825

[45] May 21, 1974

[54] SEMICONDUCTOR WAFER TRANSPORT DEVICE

[75] Inventor: Hans Dieter Friedrich Konrad Enderlein, Konstanz, Germany

[73] Assignee: John B. Sowell, Ardmore, Pa.

[22] Filed: Nov. 3, 1972

[21] Appl. No.: 303,653

[52] U.S. Cl. .................. 432/122, 432/126, 432/253

[51] Int. Cl. .............................................. F27b 9/14

[58] Field of Search ........... 432/122, 123, 126, 210, 432/120, 253

[56] References Cited

UNITED STATES PATENTS 3,051,812 8/1962 Gschwender .................. 432/126 X 3,604,694 9/1971 Muller ............................... 432/253

*Primary Examiner*—John J. Camby

*Attorney, Agent, or Firm*—John B. Sowell

[57] ABSTRACT

A transport system for conveying semiconductor wafers through a process tube of a diffusion furnace having both fixed wafer support means and movable wafer transport means inside the process tube, the movable wafer transport means being moved inside the process tube by movable frame means mounted external of the process tube to lift the semiconductor wafers and advance them a predetermined distance along the fixed wafer support means.

14 Claims, 5 Drawing Figures

SEMICONDUCTOR WAFER TRANSPORT DEVICE

BACKGROUND OF THE INVENTION

The present invention is an improvement in a diffusion furnace of the type employed to process semiconductor wafers. Heretofore, it was common practice to load a plurality of semiconductor wafers in a large mass quartz or graphite tray or holder, commonly referred to as a boat, and manually move the loaded holder into and out of the hot-zone of the diffusion furnace. The most advanced furnaces have temperature controllers which permit extremely accurate high temperature conditions to be rapidly achieved and maintained. When the semiconductor wafers are inserted into the hot-zone of the furnace in a holder the combination of holder and wafers constitute a large mass of relatively cold material which decreases the temperature in the hot-zone. Temperature curves or profiles of the wafers indicate that the cold holder delays heat-up and cool-down of the wafers as they are brought into the hot-zone of the furnace. This condition creates considerable difficulty in establishing a proper time-temperature relationship for hot-zone processes.

By running simultaneous temperature profiles of a plurality of points on both wafers and the holder it has been found that the holder and the various wafers do not maintain identical profiles during heat-up or cool-down.

When wafers are mounted in a holder in close proximity one to another the process gas does not reach all semiconductor wafers at the same time nor is the process of equal intensity on all surfaces of the wafer.

As a result of these and other process problems it is an accepted practice to permit tolerances in processes which may vary between ± 10 and ± 20 percent in order to achieve acceptable yields.

It has long been desirable to achieve higher yields of acceptable semiconductor devices which have smaller deviation one from another. It would be desirable to achieve these ends while eliminating the requirement of human monitoring and manual handling.

BRIEF SUMMARY OF THE INVENTION

The present invention eliminates the need for manual handling and monitoring in the hot-zone of a diffusion furnace. The means employed to achieve the invention do not disturb the equilibrium temperature of the hot-zone and provides uniform exposure of the semiconductor wafers to the process gases by eliminating large mass holders or carriers.

A principal object of the invention is to provide an automatic and adjustable transport means which eliminates manual handling of semiconductor wafers.

Another object of the present invention is to automatically move semiconductor wafers through the hot-zone of a diffusion furnace in predetermined time and distance steps in order to meet exact process requirements.

Another object of the present invention is to periodically lift each wafer from its fixed support and advance it an incremental step before replacing it on its fixed support to prevent process adhesive deposits from forming between the wafer and the fixed support.

Accordingly, there is provided fixed wafer support means and movable wafer transport means in the process tube. The ends of the movable wafer transport means are extended from the end of the process tube and cooperate with movable frame means which impart a lifting, advancing, lowering and retracting motion to the movable wafer transport means and advance the semiconductor wafers through the process tube. These and other features of the present invention will be set forth in greater detail in the following description.

DESCRIPTION OF THE PREFERRED EMBODIMENT

Figure 1:
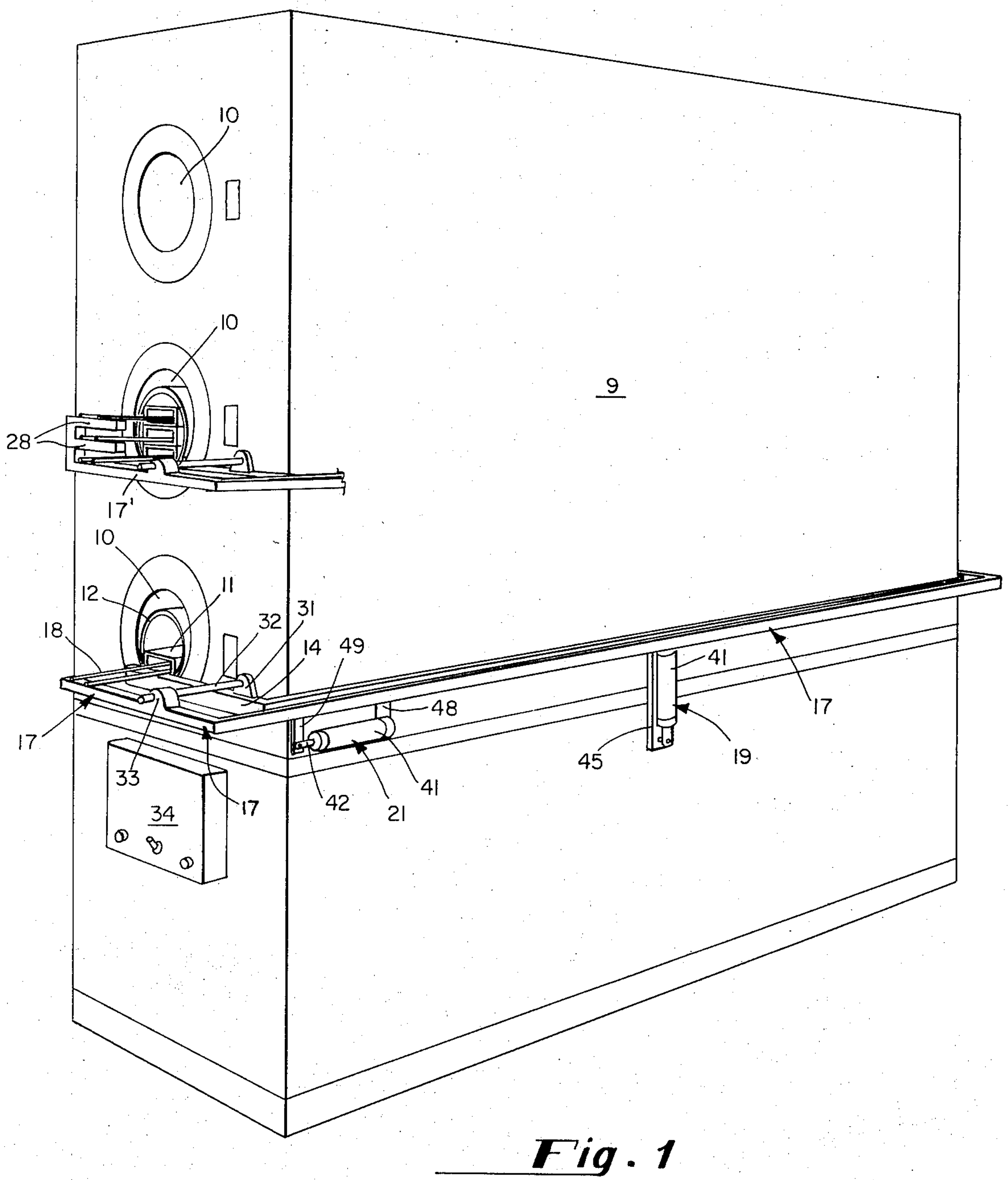
FIG. 1 is a perspective view of a typical diffusion furnace showing an outer movable frame on the furnace.
Figure 2:
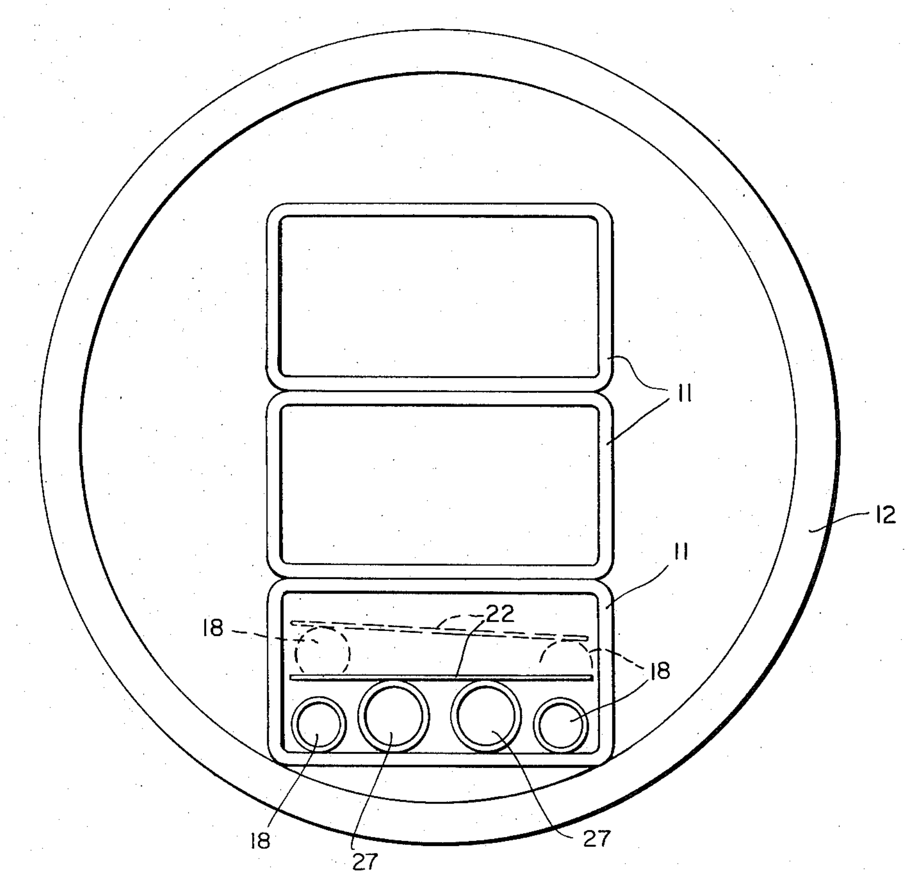
FIG. 2 is an enlarged end elevation view of a stack of process tubes.
Figure 3:
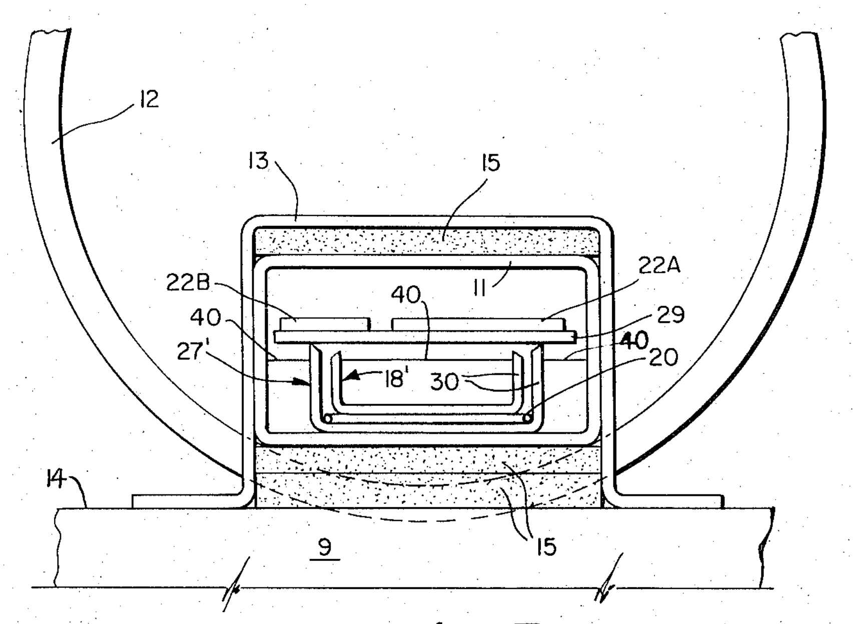
FIG. 3 is an enlarged end elevation view of a process tube having a modified form of wafer transport means.

FIG. 1 shows a typical three tube diffusion furnace 9 of the type having three separate heated chambers 10 (having hot-zones not shown) for receiving process tubes 11 inside of a protective shell 12 which extend through the hot-zone of the furnace. As best shown in FIGS. 2 and 3, rectangular process tubes 11 are supported in the protective shells 12 by resting on the ceramic protective shells 12 or on each other. Process tubes 11 preferably extend outside the furnace 10 and beyond the protective shell 12 where they are held fixed by brackets 13 which are mounted on furnace support frame 14. When a plurality of process tubes 11 are stacked one upon another a bracket like bracket 13 is extended to hold all the tubes 11. Insulating pads 15 cushion the ends of the process tubes 11 and inhibit heat transfer to the brackets 13 and support frame 14.

Furnace support frame 14 is a fixed part of the outer furnace shell and also serves to support the wafer transport system 16 comprising a movable frame 17 which supports wafer transport means 18 mounted thereon. Pneumatic drive means 19 serves to rock movable frame 17 and pneumatic drive means 21 serves to reciprocate the frame 17. Wafer transport means 18 are preferably made of high temperature shock resistant quartz. Tube 18 shown in FIG. 2, and channel shaped members 18' shown in FIG. 3, are commercially available materials which will not react with the wafer 22 or the process gases which are employed in diffusion furnaces.

Figures 4, 5:
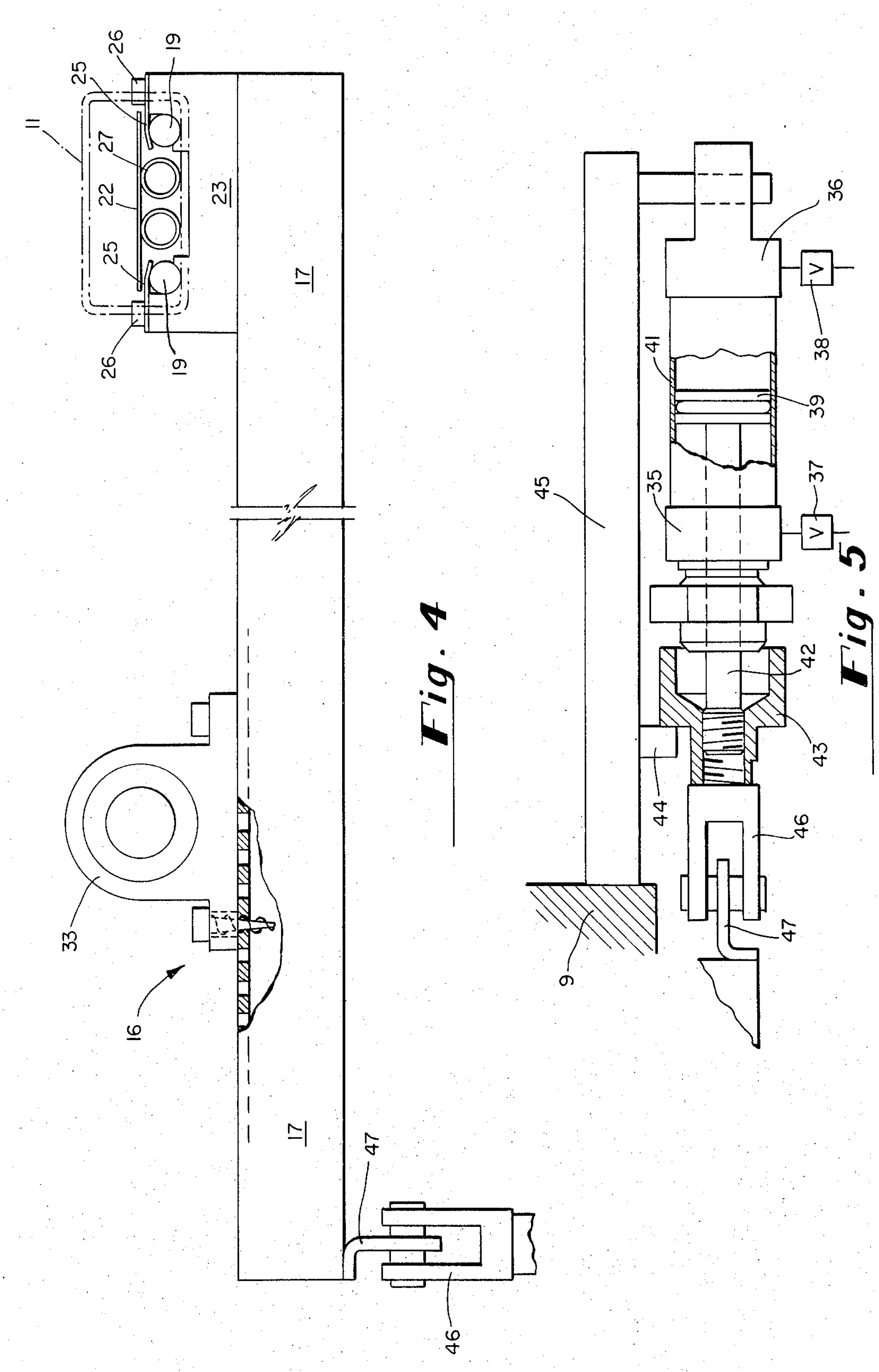
FIG. 4 is an enlarged end elevation view of a preferred movable frame means and tube clamp.
FIG. 5 is an enlarged detail of an atuating piston of the type employed to displace the movable frame means.

As best shown in FIGS. 1 and 4, tube shaped wafer transport means 18 extend beyond process tube 11 and terminate over movable frame 17. A clamping block 23, affixed to frame 17, has a shaped recess 24 therein adapted to receive in surface to surface contact tubes 18. Spring elements 25, held by screws 26, resiliently hold tubes 18 in recess 24. It will be understood that movable frame 17 is C-shaped and extends symmetrically beyond the ends of furnace 10 and that both ends of tubes 18 are held by similar clamping blocks 23 mounted on movable frame 17. Since temperatures in the hot-zone of the diffusion furnace 9 reach approximately 1,300° C, tubes 18 lose part of their structural strength and attempt to sag in the middle between clamping blocks 23, however the ends are held taut by spring elements 25 and the ends of tubes 18 are free to move with thermal expansion and contraction.

Wafers 22 are preferably placed on fixed wafer support means 27 at one open end of the process tube 11. Drive means 19 rocks the movable frame by pulling down on the frame 17 at its connection point which causes wafer transport means 18 to pivot upward (as shown in phantom line in FIG. 2) lifting wafer 22 from the support means 27. While wafer 22 is so elevated, drive means 21 moves movable frame 17 and wafer transport means 18 parallel to the process tube 11. Transport means 18 are then lowered to place wafer 22 on fixed support means 27. While in the lowered position, shown in FIG. 2, wafer transport means 18 and frame 17 are returned to their former position. In the preferred mode of operation the motion of transport means 18 is smooth and intermittent so as not to cause wafers 22 to change positions or parts of wafers to fall off their supporting structura.

FIG. 2 shows a protection shell 12 which fits just inside the resistance heating coil (not shown) in the furnace. Such shells are usually made of ceramics, alumina and silica which could react with process gases. Process tubes 11 are made of quartz which is non porous and contains the process gases which are usually introduced at the end opposite where the wafers are introduced. Fixed wafer support means 27 and wafer transport means 18 are preferably made of quartz so they do not affect the process. Quartz crystallizes slowly when heated and may crack upon cooling. Process tubes 11 and wafer support means 27 are fixed relative to the hot-zone and do not heat and cool. Since wafer transport means 18 reciprocates only about one-quarter inch in one to five second cycles it is not subject to crystallization cracking as occurred when heavy holders were used in the prior art.

Heavy holders generally weighed 100 to 550 grams and were seven to 22 inches long. The total cycle in the hot-zone is about one-half hour to one hour. Heating a heavy holder from room temperature to process temperature could require 15 minutes of the process time, thus, it is understandable that the mass of a heavy holder loaded with many wafers would serve as a heat sink which disrupts the equilibrium temperature in the hot-zone. It was common practice in the prior art to raise the hot-zone temperature in anticipation of the thermal cooling effect of a heavy holder or large cold mass of material.

In the present invention, single wafers are continuously moved through the hot-zone so there is no upset or change in the equilibrium temperature in the hot-zone. The constant and predictable temperature in the hot-zone enables faster processing and very accurate processes as well as eliminating the cause of temperature fluctuations. Wafers processed by the present invention are more uniform and have higher yields.

It may be desirable to stack several process tubes 11 in one protective shell 12 as shown in FIG. 2. When this is done another movable arm 28 may be added to the movable frame 17 or 17'. Additional movable frames 18' are preferably driven by independent drive means 19, 21 since such diffusion furnaces need to be able to conduct different processes in the same furnace.

In some of the anticipated processes, wafers 22A or parts of wafers 22B which do not traverse the whole process tube 11 are to be expected. Under such conditions it is desirable to place such wafers 22A, 22B on a thin carrier 29 as shown in FIG. 3. Thin carriers 29 may be rectangular or circular shaped and may be made of quartz, silicon, silicon carbide or other materials which are compatible with the wafers and the process.

Some processes form a fluid coating on the wafers which tends to cause wafers to stick to the fixed wafer support means 27. Such sticking is minimized by lifting and advancing the wafer 22 through the process tube 11. When a thin carrier 29 is employed, as shown in FIG. 3, the gases are not free to deposit on the lower side of the wafer 22, and sticking of the wafer is substantially eliminated as well as avoiding the danger of small wafers 22A and chips of wafers 22B falling into the moving parts or remaining in the process tube 11.

Nesting chanel shaped wafer transport means 18' and fixed wafer support means 27' have at least two upward extending arms 30 and tend to be more structurally rigid than tubes and will transport both large and small wafers without a carrier 29. Baffles 40 may be added in wafer transport means 18' and/or between process tube 11 and fixed wafer support means 27' to increase rigidity and impede gas flow. When the ends of arms 30 are beveled or tapered sticking is minimized. Further, a plurality of transverse spacers 20 may be placed intermediate means 18' and 27' to avoid large area contact and sticking.

Wafer support means 27, 27' always rest on the bottom of process tube 11 so there is no sagging. Wafer transport means 18 rests on the bottom of process tube 11 approximately fifty percent of the time, thus substantially eliminating sagging.

A shaft support 31 on support frame 14 has a shaft 32 which extends through bearing block 33 on movable frame 17. It will be understood that support 31 and block 32 may be moved along their respective supporting structure to vary the lengths of the lever arms of the movable frame 17. When pneumatic drive means 19 moves frame 17 it pivots on shaft 32. When pneumatic drive means 21 moves frame 17 it slides on shaft 32. The sequencing of drive means 19, 21 may be accomplished simultaneously or sequentially by several known means such as electrical timing controls 34 arranged to operate solenoid valves.

FIG. 5 shows a typical pneumatic drive means 19 which may be operated by vacuum or pressure lines connected to the end caps 35, 36. Vacuum and/or pressure applied via valves 37, 38 cause piston 39 in cylinder 41 to move shaft 42 in a desired direction. A limit collar 43 on shaft 42 is adapted to engage end cap 35 and may be adjusted to limit the stroke of the shaft 42 in one direction. An adjustable stop 44 on fixed support 45 on the furnace 9 limits the stroke in the opposite direction. End cap 36 is pivotally mounted on fixed support 45. Shaft 42 is provided with a bifurcated link 46 which loosely and pivotally supports an angle bracket 47 which is mounted on movable frame 17. The ends of drive means 19 are free to pivot and follow the motion of frame 17. Similarly, drive means 21 is pivotally supported on a fixed support 48 on the furnace 9 and a movable support 49 fixed to the movable frame 17.

Having explained a preferred embodiment of the present invention it will be understood that the present transport system is superior to continuous chain conveyor and any system which slides wafers in and out. While the reciprocating drive has been illustrated with pneumatic cylinders it should be understood that a walking beam conveyor driven by an electric motor or motors may be arranged to have a moving drive beam pass through the furnace chamber 10 to serve the same purpose as the wafer transport means 17 which extend around the chamber 10.

The transport system 16 illustrated and explained presents the least amount of structure at the open accessible ends of the process tubes 11, thus making it easy to adapt the invention to automatic wafer loading and unloading transport devices.

It will be understood that the pneumatic drive means 19, 21, 35 may be replaced by motors and cams mounted in place of said drive means 19, 21 or mounted on frame 14 opposite the ends of process tube 11. Such systems are more expensive and more complex but are reliable and permit extensive control adjustment of time and work stroke.

We claim:

1. A transport system for a diffusion furnace comprising, a process tube extending through a hot-zone of a diffusion furnace and having accessible open ends for loading and unloading semiconductor devices, support means connected to said diffusion furnace external of the process tube, movable frame means mounted on said support means for lifting and reciprocating movement relative thereto, fixed wafer support means extending through said process tube for normally supporting semiconductor wafers, and wafer transport means extending through said process tube, said transport means being supported and moved by said movable frame means for lifting said semiconductor wafers from said fixed wafer support, advancing said semiconductor wafers a predetermined distance in said process tube and returning said semiconductor wafers to said fixed wafer support means.

2. A transport system as set forth in claim 1 which further includes a low mass protective carrier for supporting said semiconductor wafers on said fixed wafer support means and said wafer transport means.

3. A transport system as set forth in claim 1 wherein said movable frame means comprises a rigid C-shaped member mounted on said support means for rocking and reciprocating motion relative thereto, said C-shaped member having a pair of arms terminating opposite the accessible ends of said process tube for supporting and moving the ends of the wafer transport means extending from the process tube.

4. A transport system as set forth in claim 1 which further includes mechanical drive means for sequentially raising, advancing, lowering and retracting said wafer transport means by imparting rocking and reciprocating motion to said movable frame means.

5. A transport system as set forth in claim 4 wherein said mechanical drive means comprise at least two pneumatic pistons operated sequentially.

6. A transport system as set forth in claim 1 wherein said wafer transport means comprises a pair of quartz tubes.

7. A transport system as set forth in claim 1 wherein said fixed wafer support means comprises a channel shaped member having at least two upwardly extending arms.

8. A transport system as set forth in claim 7 wherein said wafer transport means comprises a beam nested and supported inside said channel shaped member when not being moved by said movable frame means.

9. A transport system as set forth in claim 1 which further includes two or more process tubes of substantially rectangular shape extending through said diffusion furnace each having fixed wafer support means and wafer transport means in each said process tube.

10. A transport system as set forth in claim 9 wherein said wafer transport means are simultaneously moved by said movable frame means and a common mechanical drive means.

11. A transport system as set forth in claim 4 wherein said drive means includes means for adjusting the rate of motion of said movable frame means.

12. A transport system as set forth in claim 4 wherein said movable frame means include means for adjusting the rocking and reciprocating motion.

13. A transport system as set forth in claim 8 wherein said wafer transport means and fixed wafer support means are provided with upwardly extending arms having tapered ends.

14. A transport system as set forth in claim 1 wherein said wafer transport means and fixed wafer support means are provided with upwardly extending arms, and baffles are connected to at least two of such arms.

* * * * *